(12) United States Patent
Sowlati

(10) Patent No.: US 6,593,797 B1
(45) Date of Patent: Jul. 15, 2003

(54) HIGH-FREQUENCY INTEGRATED TRANSISTOR MODULE

(75) Inventor: Tirdad Sowlati, Costa Mesa, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/174,317

(22) Filed: Jun. 18, 2002

(51) Int. Cl.[7] .............................................. H03K 17/60
(52) U.S. Cl. ...................................... 327/478; 327/310
(58) Field of Search ................................ 327/478, 480, 327/577, 108, 109, 112, 379–391, 310, 313

(56) References Cited

U.S. PATENT DOCUMENTS 5,345,192 A * 9/1994 Green .......................... 327/535
5,594,384 A * 1/1997 Carroll et al. ................. 327/58
5,900,765 A * 5/1999 Kawasaki et al. ........... 327/362
6,448,859 B2 * 9/2002 Morizuka .................... 330/295

* cited by examiner

Primary Examiner—Toan Tran
(74) Attorney, Agent, or Firm—Steven R. Biren

(57) ABSTRACT

A high-frequency integrated transistor module includes a bipolar transistor having at least one emitter finger, which is internally connected in series with a resistor to provide a DC current path for the circuit, and is internally connected in series with a capacitor to provide an RF current path for the module separate from the DC current path. The capacitor may be coupled to an RF ground connection, and the value of the capacitor may be selected to resonate with the value of the RF ground connection inductance in order to provide gain enhancement at a selected operating frequency range. In order to provide gain enhancement over a broader frequency bandwidth, two or more emitter fingers can be connected in series with respective capacitors of different values in order to provide at least two RF current paths having different resonant frequencies.

6 Claims, 1 Drawing Sheet

HIGH-FREQUENCY INTEGRATED TRANSISTOR MODULE

FIELD OF THE INVENTION

The invention is in the field of semiconductor devices, and relates more particularly to high-frequency integrated transistor modules.

BACKGROUND OF THE INVENTION

Bipolar transistors, typically having multiple emitter fingers, can be used in power amplifier circuits suitable for operation at high frequencies in the gigahertz range. However, amplifier circuits employing conventional transistors of this type suffer from a number of drawbacks.

First, when such transistors are used in high-frequency amplifiers, the ground inductance of the circuit limits the gain of the power amplifier. Even a relatively small ground inductance can have a substantial impedance at these high operating frequencies, and costly and space-consuming measures (such as the use of multiple downbonds) must be employed to minimize ground inductance and associated circuit losses.

Second, emitter ballasting in the form of series-connected resistors is typically required for bipolar transistors to avoid thermal runaway and to provide uniform drive when transistors having multiple emitter fingers are used in high-frequency amplifiers. Although such resistors are only required for DC operation, both the high-frequency and DC signals pass through the ballast resistors connected in series with the emitter fingers, thus providing an unwanted attenuation of the high-frequency signal.

Accordingly, it would be desirable to have a high-frequency integrated transistor module suitable for use in high-frequency amplifier circuits in which the drawbacks associated with using the same emitter and ballast resistor connections for both DC and high-frequency signals are minimized.

SUMMARY OF THE INVENTION

It is therefore an object of the invention to provide a high-frequency transistor module in which a bipolar transistor having at least one emitter finger with multiple connections is provided, and in which gain reduction due to ground inductance and ballast resistor attenuation is minimized.

It is a further object of the invention to provide a high-frequency transistor module that is compact and economical to manufacture.

In accordance with the invention, these objects are achieved by a new high-frequency transistor module which includes a bipolar transistor having at least one emitter finger, with the emitter finger being internally connected in series with a resistor within the module to provide a DC current path for the transistor module. Additionally, the emitter finger is internally connected in series with a capacitor within the module to provide an RF current path for the transistor module separate from the DC current path.

In a preferred embodiment of the invention, the series-connected capacitor is coupled to an RF ground connection, and the capacitance of the capacitor and the inductance of the RF ground connection are selected to provide gain enhancement in a desired operating frequency range.

In a further preferred embodiment of the invention, the bipolar transistor includes a plurality of emitter fingers, with each emitter finger being internally connected to a respective resistor and a respective capacitor within the module.

High-frequency transistor modules in accordance with the present invention offer a significant improvement in that the effect of signal losses due to ground inductance and emitter ballasting resistors is minimized. Additionally, high-frequency transistor modules in accordance with the present invention are compact in size and economical to manufacture.

These and other aspects of the invention will be apparent from and elucidated with reference to the embodiments to be described hereinafter.

BRIEF DESCRIPTION OF THE DRAWING

The invention may be more completely understood with reference to the following description, to be read in conjunction with the accompanying drawing, in which.

DESCRIPTION OF THE PREFERRED EMBODIMENTS

Figure 1:
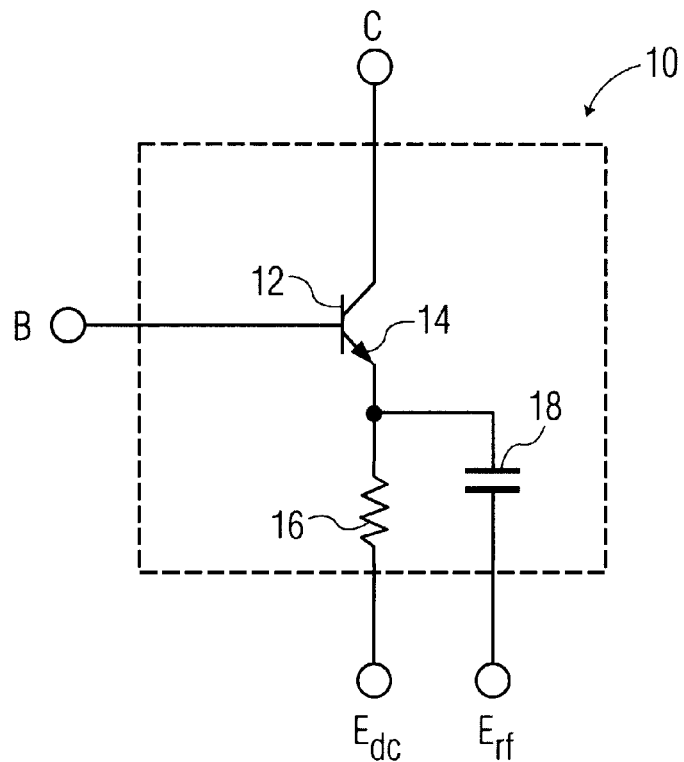
FIG. 1 shows a single transistor cell high-frequency transistor integrated module in accordance with a first embodiment of the invention.

A single transistor cell high-frequency transistor integrated module 10 in accordance with a first embodiment of the invention is shown in FIG. 1. The transistor module 10 includes a bipolar transistor 12 having collector (C) and base (B) terminals, and an emitter finger 14 which is internally connected within the module in series with an integrated resistor 16, and also in series with an integrated capacitor 18 within the module. The series path of the emitter finger 14 and resistor 16 provide a DC current path to an external DC emitter connection ($E_{dc}$) and the series connection of the emitter finger 14 and the capacitor 18 provide a series connection to an external AC emitter connection ($E_{rf}$).

By providing separate RF and DC current paths, it becomes possible to separate and therefore more easily optimize the performance parameters for both DC and RF operation of the transistor module. The resistor 16 in the DC current path serves as a ballast resistor for temperature compensation without degrading RF performance, while the RF path employs capacitive coupling using capacitor 18 in order to permit gain enhancement and avoid resistive attenuation. At RF frequencies, this capacitance at the emitter is seen as a negative impedance at the base of the transistor, and this negative impedance can be optimized for gain enhancement at a desired frequency band. Furthermore, this capacitive path can resonate with the wire bond inductance inherent in the circuit to provide a very low RF impedance to the emitter of the transistor at a desired frequency. This is an important commercial advantage in that it eliminates the need for multiple downbonds to achieve a desired low inductance level. Additionally, this technique provides an inherent frequency selection or filtering function, and avoids oscillations at lower frequencies which might otherwise occur due to higher intrinsic gain of the transistor at such lower frequencies.

Figure 2:
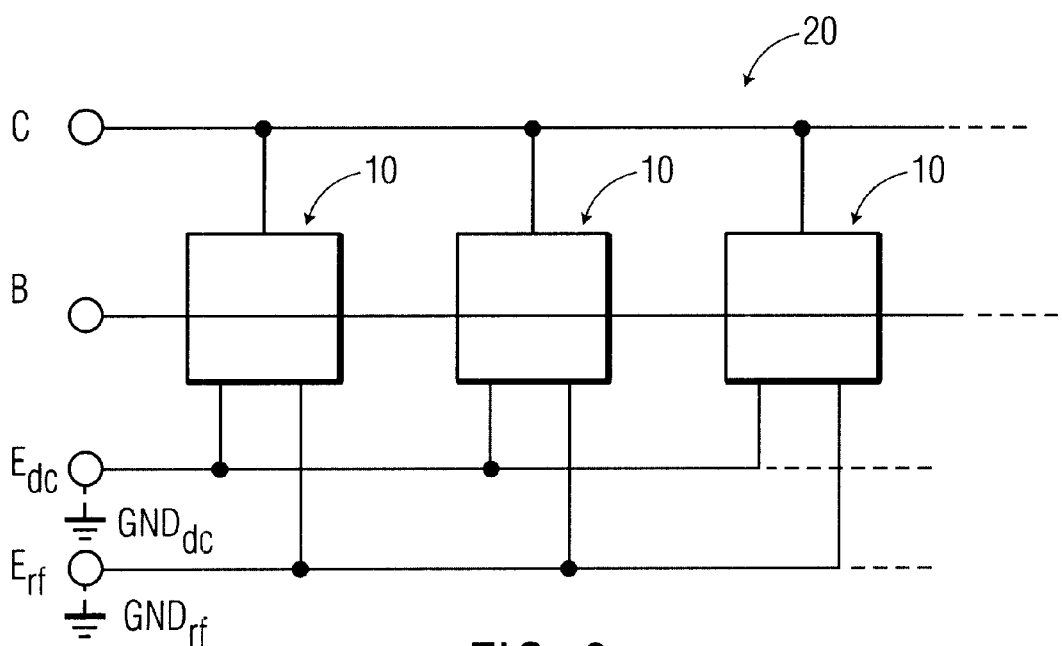
FIG. 2 shows a multi-finger transistor high-frequency integrated transistor module in accordance with a second embodiment of the invention.

A second embodiment of the invention, in which a number of single transistor cells 10 are connected together to schematically represent a multi-finger integrated transistor module 20 is shown in FIG. 2. Although only three transistor cells 10 are shown in FIG. 2, it will be recognized that a typically RF power transistor may contain tens or even hundreds of emitter fingers. The integrated transistor module 20 has a common collector connection (C), a common base connection (B) and separate DC and AC emitter connections ($E_{dc}$, and $E_{rf}$), with the emitters being typically connected in operation to separate DC and AC ground connections, as shown by the dashed connections to $GND_{dc}$ and $GND_{rf}$. When the capacitors 18 of FIG. 1 are connected to the RF ground connection, the capacitance of the capacitors and the inductance of the RF ground connection can be collectively selected to provide gain enhancement in a desired operating frequency range.

It will be understood that various different connection possibilities exist within the scope of the invention. For example, the transistor 12 in FIG. 1 may schematically represent several transistor cells with several emitter fingers connected to a common resistor 16 and transistor 18, with each module 10 in FIG. 2 then having several emitter fingers connected to one resistor/capacitor pair, so that each grouping of emitter fingers represented schematically by emitter 14 in FIG. 1 will have a single DC emitter connection and a single RF emitter connection extending from each module 10 as shown in FIG. 2.

An additional advantageous feature may be obtained with the embodiment shown in FIG. 2 by providing at least two different emitter fingers 14 within two modules 10 with capacitors 18 (all as shown in FIG. 1) of different capacitive values. This will provide two different RF current paths which resonant with the inductance of the RF ground connection at two different frequencies to provide gain enhancement in two different desired operating frequency ranges, thus obtaining gain enhancement over a broader frequency range.

In this manner, the present invention provides a high-frequency integrated transistor module in which circuit losses and high-frequency attenuation are minimized in a compact and economical to manufacturer structure. Additionally, RF performance at a desired frequency or within a desired frequency range may be selectively enhanced.

While the invention has been particularly shown and described with reference to a preferred embodiment thereof, it will be understood by those skilled in the art that various changes in form and detail may be made without departing from the spirit and scope of the invention.

What is claimed is:

1. A high-frequency integrated transistor module comprising a bipolar transistor having at least one emitter finger, said at least one emitter finger being internally connected in series with a resistor within said module to provide a DC current path for said transistor module and internally connected directly to and in series with a capacitor within said module to provide an RF current path for said transistor module separate from said DC current path.

2. A high-frequency integrated transistor module as in claim 1, wherein said capacitor is coupled to an RF ground connection, and wherein a capacitance of said capacitor and an inductance of said RF ground connection are selected to provide gain enhancement in a desired operating frequency range.

3. A high-frequency integrated transistor module as in claim 2, wherein said resistor is coupled to a DC ground connection.

4. A high-frequency integrated transistor module as in claim 1, wherein said bipolar transistor comprises a plurality of emitter fingers, each emitter finger being internally connected in series with a respective resistor and with a respective capacitor within the module.

5. A high frequency integrated transistor module as in claim 1, comprising at least two emitter fingers, each of said emitter fingers being connected to a respective capacitor of a different value to provide at least two different RF current paths separate from said DC current path.

6. A high-frequency integrated transistor module as in claim 5, wherein each of said respective capacitors are coupled to an RF ground connection, and wherein the values of said respective capacitors and an inductance of said RF ground connection are selected to provide gain enhancement at different selected operating frequency ranges.

* * * * *